US006855236B2

United States Patent
Sato et al.

(10) Patent No.: US 6,855,236 B2
(45) Date of Patent: Feb. 15, 2005

(54) COMPONENTS FOR VACUUM DEPOSITION APPARATUS AND VACUUM DEPOSITION APPARATUS THEREWITH, AND TARGET APPARATUS

(75) Inventors: Michio Sato, Kanagawa-ken (JP); Takashi Nakamura, Kanagawa-ken (JP); Yoichiro Yabe, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 43 days.

(21) Appl. No.: 09/926,041

(22) PCT Filed: Dec. 28, 2000

(86) PCT No.: PCT/JP00/09379

§ 371 (c)(1),
(2), (4) Date: Aug. 20, 2001

(87) PCT Pub. No.: WO01/48260

PCT Pub. Date: Jul. 5, 2001

(65) Prior Publication Data

US 2003/0121777 A1 Jul. 3, 2003

(30) Foreign Application Priority Data

Dec. 28, 1999 (JP) ............................................. 11-375686
Dec. 28, 1999 (JP) ............................................. 11-375687

(51) Int. Cl.[7] ........................... C23C 16/00; C23C 14/34
(52) U.S. Cl. ............................ 204/298.11; 204/298.02; 204/298.12; 204/298.14; 204/298.15; 118/715; 118/720; 118/723 E; 118/728
(58) Field of Search ....................... 204/298.12, 298.13, 204/298.02, 298.11, 298.14, 298.15; 118/715, 720, 723 E, 728

(56) References Cited

U.S. PATENT DOCUMENTS 6,235,120 B1 * 5/2001 Bang et al. ................. 118/725
6,250,251 B1 * 6/2001 Akiyama et al. ........ 118/723 E

FOREIGN PATENT DOCUMENTS

JP        60-26659       2/1985
JP        61-56277       3/1986

(List continued on next page.)

OTHER PUBLICATIONS

Machine translation of 11-345780.*
Machine translation of 09-272965.*

*Primary Examiner*—Rodney G. McDonald
(74) *Attorney, Agent, or Firm*—Oblon, Spivak, McClelland, Maier & Neustadt, P.C.

(57) ABSTRACT

A component for a vacuum deposition apparatus comprises a component body and a spray deposit formed on a surface of a component body. A spray deposit has surface roughness in which a mean spacing S of tops of local peak of profile is in the range from 50 to 150 μm, and distances to a bottom of profile valley line Rv and to a top of profile peak line are in the ranges from 20 to 70 μm, respectively. Furthermore, a spray deposit has a low hardness coat selected from an Al base spray deposit of Hv 30 (Vickers hardness) or less, a Cu base spray deposit of Hv 100 or less, a Ni base spray deposit of Hv 200 or less, a Ti base spray deposit of Hv 300 or less, a Mo base spray deposit of Hv 300 or less and a W base spray deposit of Hv 500 or less. Such component for a vacuum deposition apparatus may suppress, with stability and effectiveness, peeling of deposition material adhering on a component during deposition. In addition, the number of apparatus cleaning and of exchange of components may be largely reduced. A target comprises a similar spray deposit. A vacuum deposition apparatus is one in which above component for a vacuum deposition apparatus is applied in a holder of a sample to be deposited, a deposition material source holder, a preventive component and so on.

18 Claims, 6 Drawing Sheets

FOREIGN PATENT DOCUMENTS

| | | |
|---|---|---|
| JP | 63-161163 | 7/1988 |
| JP | 63-243269 | 10/1988 |
| JP | 4-268065 | 9/1992 |
| JP | 6-196437 | 7/1994 |
| JP | 7-62519 | 3/1995 |
| JP | 8-176816 | 7/1996 |
| JP | 8-277461 | 10/1996 |
| JP | 9-87834 | 3/1997 |
| JP | 09-272965 | * 10/1997 |
| JP | 9-275082 | 10/1997 |
| JP | 10-204604 | 8/1998 |
| JP | 10-273339 | 10/1998 |
| JP | 11-345780 | * 12/1999 |

* cited by examiner

COMPONENTS FOR VACUUM DEPOSITION APPARATUS AND VACUUM DEPOSITION APPARATUS THEREWITH, AND TARGET APPARATUS

TECHNICAL FIELD

The present invention relates to a component for a vacuum deposition apparatus that can be used in the vacuum deposition apparatus such as a sputtering apparatus and a CVD apparatus, a vacuum deposition apparatus therewith, and a target apparatus used for the sputtering apparatus or the like.

BACKGROUND

In semiconductor components and liquid crystal components, by making use of a deposition process such as sputtering and CVD technique, various kinds of interconnections and electrodes are formed. Specifically, on a deposition substrate such as a semiconductor substrate or a glass substrate, by applying such as sputtering and CVD technique, a conductive metal thin film of such as Al, Ti, Mo, W or Mo—W alloy, a conductive metal compound thin film of such as $MoSi_2$, $WSi_2$ and $TiSi_2$, or a metal compound thin film of such as TiN and TaN, is formed. These thin films each are used for an interconnection layer, electrode layer, barrier layer and under-layer (liner material).

In the vacuum deposition apparatus such as the sputtering apparatus or the CVD apparatus that is used for the deposition of the above thin films, it is avoided with difficulty that during the deposition, also on various components disposed in the deposition apparatus, deposition material adheres and piles up. Such deposition material (adhered film) adhered and piled up on such components, in the course of the deposition, peels off the components and becomes causes of dust. Such dust, when coming into the film on the deposition substrate, after the formation of the interconnections, causes interconnection failure such as short circuit or open circuit, resulting in lowering product yield.

From these circumstances, in the existing vacuum deposition apparatus, apparatus components such as a deposition preventive plate or a holder of a target are formed from target material or material close in thermal expansion coefficient therewith. Alternatively, on a surface of the apparatus component a film of the target material or material of which thermal expansion coefficient is close thereto is formed (cf. Japanese Patent Laid-open Application Nos. JP-A 60-26659, JP-A 63-161163, JP-A 63-243269 and so on). On the basis of such configuration, peeling of adhered film due to the difference of thermal expansion coefficients of the apparatus component and the deposition material can be suppressed from occurring.

However, when the components themselves of the vacuum deposition apparatus are formed of the target material or the like, lowering in mechanical strength of the components may be caused. In addition, due to stress of the deposition material (adhered film) adhered on the components, the adhered film may peel. On the other hand, when a coat of the target material is formed on the surface of the component, depending on an applied method, the coat itself tends to peel.

Furthermore, Japanese Patent Laid-open Application No. JP-A 61-56277 discloses that on the surface of the component, spray deposit of Al or Mo is formed, and surface roughness of the spray deposit is made to be 200 $\mu$m or more. In this application, based on the surface roughness of the spray deposit, the deposition material adhered on the components is suppressed from peeling. Components for deposition apparatus that make use of the spray deposit are also disclosed in Japanese Patent Laid-open Application No. JP-A 9-272965, for instance. In this application, an amount of gas remaining in the spray deposit formed on the surface of the apparatus components is stipulated to be 10 Torr·cc/g or less.

Components of the deposition apparatus that make use of the existing spray deposit, mainly based on large surface roughness of the spray deposit, suppress the deposition material (adhered film) adhered on the component surface from peeling. Such countermeasure for suppressing the adhered film from peeling can exhibit a certain degree of effect. However, due to the surface roughness of the spray deposit, there is caused a large unevenness on the surface of the adhered film, the large unevenness on the surface of the adhered film causing fine dust (particles) to occur on the contrary. Furthermore, based on the internal stress of the deposition material adhered on the component surface, the adhered film peels off. The peeling also causes the dust to occur.

In particular, in recent semiconductor elements, in order to attain such high integration degree as 64M, 256M and 1G, an interconnection width is demanded to be made extremely narrow such as 0.3 $\mu$m, 0.18 $\mu$m, furthermore 0.1 $\mu$m. In such extremely narrowed interconnection and an element therewith, if an ultra-fine particle (minute particle) of a diameter of approximately 0.2 $\mu$m for instance come to mingle with, interconnection failure or element failure will be caused.

Under such extremely severe conditions, by means of the existing dust preventive countermeasure (particle preventive countermeasure) such as mentioned above, manufacture yield of highly integrated semiconductor elements and so on can be heightened with difficulty. In order to heighten the manufacture yield of the semiconductor elements that have densely packed interconnections, it is strongly demanded to suppress the generation of the fine dust (particle) due to the apparatus components. Furthermore, the problems of the dust, without restricting to the components of the deposition apparatus are similarly occurring in the sputtering target or a backing plate for cooling and holding the sputtering target.

Furthermore, only to form the spray deposit on the surface of the apparatus components, due to the stress remaining inside the spray deposit, is likely to cause the spray deposit itself to peel off. When the spray deposit or the deposition material (adhered film) adhered thereon peels, suddenly the generation of the dust increases. Accordingly, ordinarily the apparatus is cleansed or the components are necessitated to exchange. The cleaning or the exchange of the components causes deterioration of working efficiency of the apparatus, resulting in an increase of deposition cost. Accordingly, it is strongly demanded, by suppressing the spray deposit for instance from peeling, to make longer the life of the apparatus components.

An object of the present invention is to provide components for a vacuum deposition apparatus and a target device that can largely suppress the generation of the dust from the adhered deposition material during the deposition process and facilitate to stably and effectively suppress the peeling of the adhered film itself. Another object of the present invention is to provide components for a vacuum deposition apparatus and a target device that can stably and effectively suppress the peeling of the film adhered during the deposition process or the spray deposit. Thereby, an increase of the deposition cost accompanying cleaning of the apparatus or exchange of the component can be suppressed, and the generation of the dust also being suppressed. Still another object of the present invention is to provide a vacuum deposition apparatus that can suppress the dust from mingling in, thereby enabling to cope with the highly integrated semiconductor elements and to reduce the deposition cost through an improvement of the working efficiency.

DISCLOSURE OF THE INVENTION

In the present invention, a first invention involving a component of a vacuum deposition apparatus is a component of a vacuum deposition apparatus (a first apparatus component) comprising a component body and a spray deposit. The spray deposit is formed on a surface of the component body and has surface roughness in which a mean spacing S of tops of local peak of profile, and distances from a mean line to a bottom of profile valley line and to a top of profile peak line, Rv and Rp, respectively, all of which is provided in JIS (Japanese Industrial Standard) B 0601-1994, are in the ranges from 50 to 150 $\mu$m, 20 to 70 $\mu$m and 20 to 70 $\mu$m, respectively.

A second invention involving a component of a vacuum deposition apparatus is a component of a vacuum deposition apparatus (a second apparatus component) comprising a component body and a spray deposit. The spray deposit is formed on a surface of the component body and has at least one low hardness coat selected from the following group: Al base spray deposit of Vickers hardness of Hv 30 or less, Cu base spray deposit of Hv 100 or less, Ni base spray deposit of Hv 200 or less, Ti base spray deposit of Hv 300 or less, Mo base spray deposit of Hv 300 or less and W base spray deposit of Hv 500 or less.

In the components for the vacuum deposition apparatus of the present invention, the spray deposit comprises preferably a coat comprising metal of which thermal expansion coefficient is different by $15 \times 10^{-6}$/K or less from that of the deposition material, or a coat comprising metal of which thermal expansion coefficient is different by $20 \times 10^{-6}$/K or less from that of the component body. In the first invention, the surface roughness of these spray deposits (coats) is provided in the above ranges. In the second invention, the above spray deposits (coats) are formed of low hardness deposit coats.

Furthermore, the spray deposits of the present invention may have two layers or more of coats consisting of different materials. As a specific configuration of such spray deposit, a structure having a stress relief layer and a thermal expansion relief layer can be cited. The stress relief layer has soft metal formed on the component body. The thermal expansion relief layer has metal of which thermal expansion coefficient is different by $15 \times 10^{-6}$/K or less from that of the deposition material. In the second invention, at least one of the stress relief layer and the thermal expansion relief layer is configured of the above low hardness coat. At that time, both the stress relief layer and the thermal expansion relief layer are more preferable to be configured of the low hardness coat.

The present vacuum deposition apparatus comprises a vacuum chamber, a holder of a sample to be deposited, a deposit material source, a holder of the deposit material source and a deposition preventive component. The sample holder is disposed in the vacuum chamber. The deposit material source is disposed in the vacuum chamber facing the sample holder. The source holder holds the deposit material source. The deposition preventive component is disposed in the surroundings of the sample holder and the source holder. In such vacuum deposition apparatus, at least one selected from the sample holder, the source holder and the deposition preventive component is formed of the above components for the vacuum deposition apparatus of the present invention (the first or second apparatus component).

A first target device in the present invention comprises a target body and a spray deposit formed in a non-erosion region of the target body. A second target device comprises a target and a backing plate. The backing plate comprises a backing plate body for holding the target and a spray deposit formed on a surface of the backing plate body.

In the target devices, a first invention comprises a spray deposit having surface roughness in which a mean spacings of tops of local peak of profile, and distances from a mean line to a bottom of profile valley line and to a top of profile peak line, Rv and Rp, respectively, all of which is provided in JIS (Japanese Industrial Standard) B 0601-1994, are in the ranges from 50 to 150 $\mu$m, 20 to 70 $\mu$m and 20 to 70 $\mu$m, respectively. A second invention comprises a spray deposit having at least one low hardness coat selected from the following group: Al base spray deposit of which Vickers hardness is Hv 30 or less, Cu base spray deposit of which Vickers hardness is Hv 100 or less, Ni base spray deposit of which Vickers hardness is Hv 200 or less, Ti base spray deposit of which Vickers hardness is Hv 300 or less, Mo base spray deposit of which Vickers hardness is Hv 300 or less and W base spray deposit of which Vickers hardness is Hv 500 or less.

In the first invention, the surface roughness of the spray deposit formed on the component body of the vacuum deposition apparatus, or on the target or the backing plate of the target device is set that the mean spacing S of tops of local peak of profile, the distances from a mean line to a bottom of profile valley line and a top of profile peak line, Rv and Rp, respectively, all of which is provided in JIS (Japanese Industrial Standard) B 0601-1994, are in the ranges from 50 to 150 $\mu$m, from 20 to 70 $\mu$m and from 20 to 70 $\mu$m, respectively.

In a spray deposit applied on a surface of the components for the existing vacuum deposition apparatus, in order to suppress the adhered deposition material (adhered film) from peeling off, the surface roughness of the spray deposit is made large. This is because due to the larger surface roughness of the spray deposit surface, it is intended to heighten an adhering force of the deposit material. However, when the adhered film piles up on the spray deposit of larger surface roughness, the surface of the adhered film may become a shape of larger unevenness. That is, the adhered film grows in a state where particles easy to peel off pileup. Accordingly, in the components that use the existing spray deposit, from the adhered film piled up on the surface thereof, particles fall off to result in dust, or in some cases the adhered film itself peels off.

To this end, in the first invention, in order for the adhered material piled up on the spray deposit to grow with stability, the surface roughness of the spray deposit formed on the surface of the component is provided by the mean spacing S of tops of local peak of profile, and the distances from a mean line to the bottom of profile valley line and to the top of the profile peak line, Rv and Rp, respectively. By growing the adhered film piled up on the spray deposit with stability, the falling of the particles from the adhered film and the peeling of the adhered film may be largely suppressed from occurring.

As mentioned above, on the basis of the prevention of the particles from falling and the suppression of the adhered film from peeling, the particles generation can be reduced. Thereby, various kinds of films formed by means of the vacuum deposition apparatus and elements and components therewith may be largely improved in its manufacture yield. Furthermore, the stabilization of the adhered film (suppression of the peeling of the adhered film) may lead to the reduction of the number of cleaning of the apparatus. Thereby, the working efficiency of the apparatus may be improved, resulting in the reduction of the deposition cost.

In the second invention, as the surface of the component body of the component for the vacuum deposition apparatus, or as at least part of the spray deposit coated on the target and backing plate of the target device, at least one low hardness coat selected from Al base, Cu base, Ni base, Ti base, Mo base and W base spray deposits, all of these having the above Vickers hardness, is used.

In the existing spray deposit, there remains internal stress that is caused during the spraying. Thereby, when the external stress is applied, the inside of the spray deposit is broken with ease. This causes the peeling of the spray deposit itself. On the other hand, in the present invention, the spray deposit softened in comparison with an ordinary one is employed. In the softened spray deposit, since the internal stress (residual stress) is relieved, when the external stress is applied during the deposition, the spray deposit may be effectively suppressed from breaking from the inside. Furthermore, by lowering the hardness of the spray deposit, the deposition material (adhered film) adhered thereon may be relieved in its internal stress. Accordingly, the adhered film itself on the spray deposit may be suppressed from peeling.

Thereby, not only the dust (particle) due to the peeling of the spray deposit and the adhered film piled up thereon may be suppressed from generating, but also the number of times of apparatus cleaning and component exchange may be largely reduced. The reduction of the dust (particle) generation amount may largely contribute in an improvement of yield of various kinds of films formed by means of the vacuum deposition apparatus and elements and components therewith. Furthermore, the reduction of the number of times of apparatus cleaning and component exchange may largely contribute in an improvement of the working efficiency of the apparatus, resulting in reduction of the deposition cost.

MODES FOR IMPLEMENTING THE INVENTION

In the following, modes for implementing the present invention will be explained.

Figure 1:
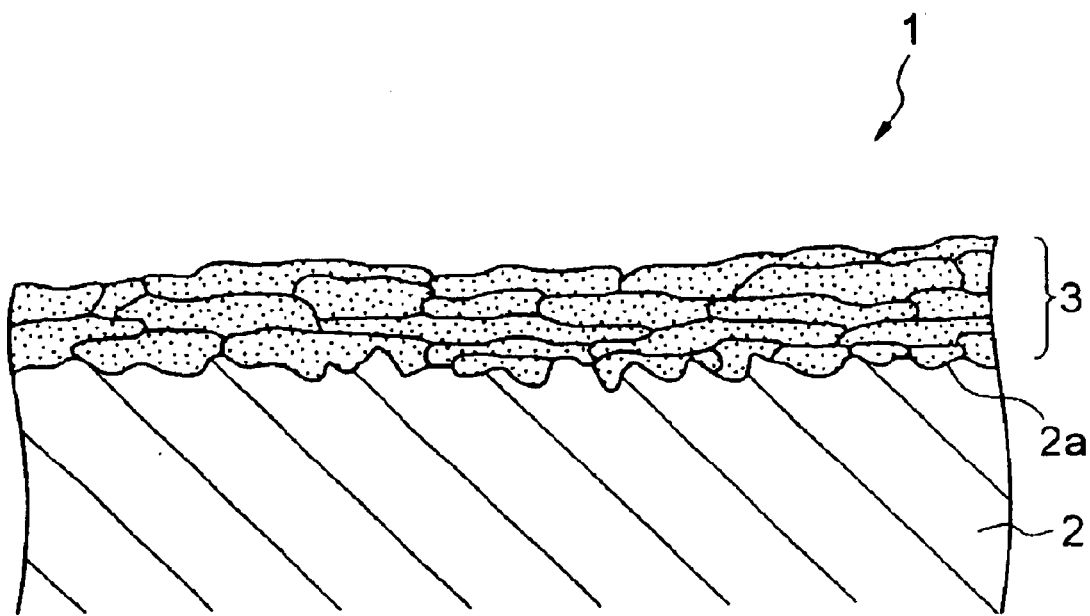
FIG. 1 is a sectional view showing an essential configuration of a component for a vacuum deposition apparatus due to one embodiment of the present invention.

FIG. 1 is a sectional view showing an essential configuration of one embodiment of a component for a vacuum deposition apparatus of the present invention. The vacuum deposition apparatus 1 shown in the figure comprises a spray deposit 3 disposed on a surface of a component body (substrate material) 2. Though constituent material of the component body 2 is not particularly restricted, for instance stainless steel generally used as constituent material of an apparatus component can be used. A surface 2a thereon the spray deposit of the component body 2 is coated is preferably roughened in advance by means of blasting so as to obtain an anchoring effect.

The above spray deposit 3, in order to suppress the particles from generating, is preferably coated by applying a spraying method capable of controlling a state of surface of the spray deposit 3. Specifically, in accordance with the shape of the constituent material of the component body 2, environmental conditions being used and spray material, plasma spraying method, ultra-high velocity flame spraying method or the like is appropriately selected to use. The spray deposit 3 is excellent in adhesion to the component body 2. Furthermore, in view of preventing the peeling at an interface between the component body 2 and the spray deposit 3 caused by a temperature rise during the deposition process, the spray deposit 3 is preferably formed of metal of which thermal expansion coefficient is different by $20 \times 10^{-6}$/K or less from that of the component body 2. More preferable difference of the thermal expansion coefficient is $15 \times 10^{-6}$/K or less, desirably being $10 \times 10^{-6}$/K or less.

The spray deposit 3, in view of preventing the peeling of the deposition material (adhered film) adhered thereon caused by the difference of thermal expansion, is preferably formed of material of which thermal expansion coefficient is different by $15 \times 10^{-6}$/K or less from that of the deposition material. More preferable difference of the thermal expansion coefficient is $10 \times 10^{-6}$/K or less, desirably being $5 \times 10^{-6}$/K or less. When considering only the relationship with the deposition material, the spray deposit 3 is preferable to be formed of the same material with the deposition material. When the film being deposited is an alloy film or a compound film, the spray deposit 3 is preferably formed of material containing at least one kind of metal element constituting the deposition material (deposition material source). By satisfying such conditions, the deposition material adhered on the spray deposit 3 may be suppressed from peeling based on the difference of the thermal expansion thereof.

The spray deposit 3, without restricting to a coat due to a single material, can be formed of for instance two or more layers of coats of different materials. As the spray deposit 3 having two or more layers of coats, a configuration comprising for instance a stress relief layer (a first coat) formed on the component body 2 and a thermal expansion relief layer (a second coat) formed on the stress relief layer can be cited.

For the stress relief layer, soft metals such as for instance Al, Cu, Ni, or alloys therebetween can be used. For the thermal expansion relief layer, metals of which thermal expansion is small in difference from that of the adhered film can be used. The specific difference of the thermal expansion coefficient of these layers from the component body 2 and the deposition material is as described above. In addition, a structure in which corrosion resistant spray deposit is formed on a surface side can be adopted. Furthermore, a structure where two or more spray deposits of different thermal expansion coefficients are formed in turn to relieve the differences of the thermal expansions from the component body 2 and the deposition material can be adopted.

The spray deposit 3 functions as a coat preventive of the peeling of the deposition material (adhered film) adhered and piled up during the deposition. When the surface of the component 1 of the vacuum deposition apparatus has a certain degree of unevenness, up to a certain thickness, the adhered film may be suppressed from peeling. However, when the thickness of the adhered film becomes thicker, it tends to peel with ease. This is because accompanying with the increase of the thickness of the adhered film, the internal stress becomes larger, on the basis thereof the adhered film peeling.

The spray deposit 3 absorbs the internal stress of the adhered film due to an internal structure containing a lot of pores and works effectively to prevent the adhered film from peeling. However, simple flame spraying causes larger surface roughness of the spray deposit. As a result, the particles are likely to fall off the adhered film or the adhered film itself tends to peel. In addition, simple flame spraying causes residual internal stress in the spray deposit, thereby the spray deposit itself becoming likely to peel due to the internal stress.

In the present invention, in the first place, in order to suppress the particles from falling or the adhered film itself from peeling due to the surface roughness of the spray deposit, the surface roughness of the spray deposit 3 is provided that the mean spacing S of tops of local peak of profile, and the distances from the mean line to the bottom of profile valley line Rv and to the top of profile peak line Rp, all of which is stipulated in JIS B 0601-1994, are in the ranges from 50 to 150 $\mu$m, from 20 to 70 $\mu$m and from 20 to 70 $\mu$m, respectively. This is based on the first apparatus components of the present invention. The present spray deposit 3 having such appropriate surface roughness may enable to suppress the particles from falling from the adhered film piled up thereon, and furthermore to stably suppress the adhered film itself from peeling.

Figure 2:
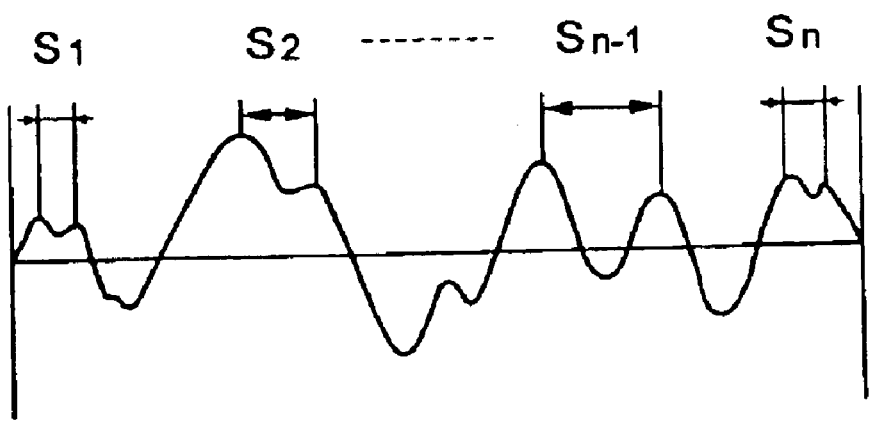
FIG. 2 is a diagram for explaining a mean spacing S of tops of local peak of profile of surface roughness applied in the present invention.
Figure 3:
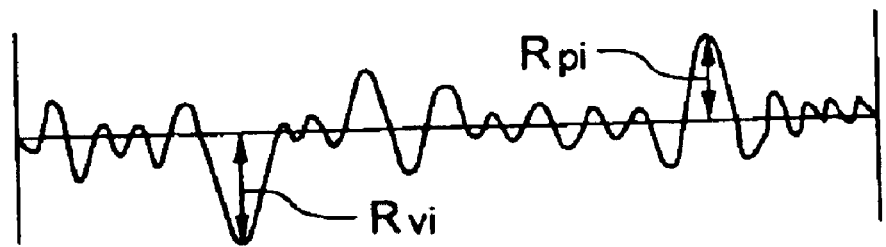
FIG. 3 is a diagram for explaining distances from a mean line to a bottom of profile valley line, Rv, and to a top of profile peak line, Rp, of surface roughness applied in the present invention.

The mean spacing S of tops of local peak of profile, one parameter of the surface roughness, as shown in FIG. 2, can be obtained in the following way from a curve obtained by means of a surface roughness tester. That is, sampling lengths L are taken in a direction of a mean line, lengths (S1, S2, . . . Sn) of the mean line corresponding to spacing between contagious local peaks are obtained, and from these measured values an average value (mm) is obtained as the mean spacing S. The distances from the mean line to the bottom of profile valley line Rv and to the top of profile peak line Rp are obtained in the following ways, respectively. That is, as shown in FIG. 3, a curve of surface roughness obtained by means of the surface roughness tester is sectioned in sampling lengths L. For each of the sampling lengths, distances from the mean line to the bottom of the profile valley Rvi and to the top of the profile peak Rpi are obtained, respectively. Among these bottoms of the profile Rvi and tops of the profile Rpi, the respective maximum values are taken as Rv and Rp, respectively.

When, as in the spray deposit applied on the surface of the existing apparatus component, the surface roughness of the surface of the spray deposit is large, the adhered film piled up thereon becomes uneven, resulting in that adhered particles are piled up in a state easy to fall. Furthermore, as the adhered film becomes thicker, the internal stress increases. At a step caused in the adhered film due to the unevenness, cracks tend to occur. This promotes for the adhered film to peel. In order to suppress the falling of the particles or the peeling of the adhered film due to the large surface roughness of such spray deposit, in the present invention, the spray deposit 3 having the surface roughness provided by the mean spacing S of tops of local peak of profile, and distances from the mean line to the bottom of profile valley line Rv and to the top of profile peak line Rp is applied.

According to the spray deposit 3 of which mean spacing S of tops of local peak of profile of the surface is in the range from 50 to 150 $\mu$m, the adhered film piled up thereon grows with a stable columnar structure, resulting in preventing the particles from falling and the adhered film from peeling. When the mean spacing S between tops of the local peak of profile is less than 50 $\mu$m, the adhered film piled up on the spray deposit grows with an unstable particle structure, resulting in the peeling of the adhered film or falling of the particles. On the other hand, when the mean spacing S between tops of the local peak of profile exceeds 150 $\mu$m, adhesion of the adhered film becomes too low, resulting in the peeling with ease of the adhered film, on the contrary. In view of effective prevention of the peeling of the adhered film, the mean spacing S between the tops of the local peaks of the surface of the spray deposit 3 is preferable to be in the range from 70 to 100 $\mu$m, being desirable to be in the range from 75 to 90 $\mu$m.

Furthermore, according to the spray deposit 3 of which distances from the mean line to the bottom of profile valley line Rv and to the top of profile peak line Rp each are in the range from 20 to 70 $\mu$m, the adhered particles can be piled up more uniformly on the surface of the spray deposit. Accordingly, the particles may be suppressed from falling (generation of the particle).

That is, when the distances from the mean line to the bottom of profile valley line Rv and to the top of profile peak line Rp each exceed 70 $\mu$m, the adhered particles are piled up without uniformity. Specifically, in the valley portions, pores may be partially formed, in addition, due to the shadowing effect of the peak portion, the adhered particles are piled up without uniformity. Thus, since the adhered particles are piled up very less stably, the particles fall from the adhered film. Furthermore, there occurs the difference in height of the piling shape of the adhered film, the adhesion of the particles piled up at a higher portion becoming lower to result in the falling of the particles.

On the other hand, when the distances from the mean line to the bottom of profile valley line Rv and to the top of profile peak line Rp each are less than 20 $\mu$m, the adhesion of the adhered film becomes lower to be likely to cause the peeling of the adhered film. In order to more effectively suppress the particles from falling (generation of particles) and to heighten the durability of the adhered film, the distances from the mean line to the bottom of profile valley line Rv and to the top of profile peak line Rp of the spray deposit 3 each are preferable to be in the range from 30 to 60 $\mu$m, more preferable to be in the range from 30 to 40 $\mu$m.

The spray deposit 3, having a complicated surface state based on the formation process, shows excellent adhesion to the adhered film. However, when the surface roughness is too large, as mentioned above, the falling of the particles or the peeling of the adhered film is caused. From these, when the surface roughness of the spray deposit 3 is expressed in terms of an arithmetical mean roughness provided in JIS B 0601-1994, the arithmetical mean roughness Ra is preferable to be in the range from 5 to 15 μm.

When the arithmetical mean roughness Ra of the surface of the spray deposit 3 exceeds 15 μm, the unevenness of the surface of the spray deposit 3 becomes too large, the adhered film becoming in an adhered shape easy to generate the particle. Furthermore, since the adhered film does not adhere on the whole spray deposit 3 and voids remain, therefrom the peeling of the adhered film is likely to occur. However, when the arithmetical mean roughness Ra of the surface of the spray deposit 3 is less than 5 μm, a holding force of the adhered film becomes lower to be likely to cause the peeling of the adhered film with ease. The arithmetical mean roughness Ra of the surface of the spray deposit 3 is preferable to be in the range from 8 to 12 μm, being more preferable to be in the range from 10 to 12 μm.

The spray deposit 3 having the surface roughness as mentioned above can be obtained for instance by applying powder flame spraying that uses powder raw material or by applying plasma spraying together with control of the diameter of powder raw material. In the powder flame spraying, in particular ultra high velocity flame spraying can be preferably applied. Specific conditions when applying the ultra high velocity flame spraying or the plasma spraying are appropriately set up in accordance with material of raw material powder or the like. For instance, by implementing the ultra high velocity flame spraying or the plasma spraying with raw material powder of which particle diameters are uniform, the spray deposit 3 having the appropriate surface roughness as mentioned above can be obtained. Furthermore, by implementing surface cleaning after the spraying, the surface roughness of the spray deposit 3 can be controlled. As the further specific conditions for controlling the surface roughness of the spray deposit 3, spraying conditions such as an electric current, a voltage, a gas flow rate, a spraying distance and a powder feed amount can be appropriately altered.

In view of obtaining an effect in preventing the peeling of the adhered film due to the spray deposit 3, a thickness of the spray deposit 3 is preferable to be appropriately adjusted. From such points, the thickness of the spray deposit 3 is preferably set in the range from 50 to 500 μm. While the spray deposit 3 has an effect to reduce the internal stress of the adhered film as mentioned above, the stress reduction effect depends on the thickness. When the thickness of the spray deposit 3 is less than 50 μm, the stress reduction effect decreases and the adhered film tends to peel. On the other hand, when the thickness of the spray deposit 3 exceeds 500 μm, a large internal stress is generated in the spray deposit 3 itself, thereby the spray deposit 3 itself tends to peel. Accordingly, the thickness of the spray deposit 3 is preferable to be in the range from 100 to 300 μm so that the above effect can be more excellently obtained, being furthermore preferable to be in the range from 200 to 250 μm.

In the spray deposit 3 based on the above first apparatus component, the surface roughness thereof is provided by the mean spacing S between the tops of the local peaks of profile in the range from 50 to 150 μm, and the distances from the mean line to the bottom of profile valley line Rv and to the top of profile peak line Rp each in the range from 20 to 70 μm. Accordingly, the particles may be effectively suppressed from peeling from the adhered film, that is, the particle may be effectively suppressed from generating. Furthermore, based on the surface roughness of the spray deposit 3, the adhered film may be suppressed from peeling.

Thus, by largely suppressing the generation of the particles due to the falling of the particles from the adhered film or the peeling of the adhered film, various kinds of films deposited by means of the vacuum deposition apparatus, furthermore elements or components therewith may be largely heightened in manufacture yield. Furthermore, by suppressing the peeling of the adhered film, the number of the times of cleaning of the apparatus may be reduced. The decrease of the number of the times of cleaning may largely contribute in an improvement of the working efficiency of the apparatus, resultantly in the reduction of the deposition cost.

In the present invention, in the second place, in order to suppress the peeling of the spray deposit itself based on the internal stress of the spray deposit 3, at least one low hardness coat selected from Al base spray deposit of which Vickers hardness is Hv 30 or less, Cu base spray deposit of which Vickers hardness is Hv 100 or less, Ni base spray deposit of which Vickers hardness is Hv 200 or less, Ti base spray deposit of which Vickers hardness is Hv 300 or less, Mo base spray deposit of which Vickers hardness is Hv 300 or less and W base spray deposit of which Vickers hardness is Hv 500 or less is applied in the spray deposit 3. This is based on the second apparatus component.

Preferable hardness for these spray deposits is Hv 25 or less for the Al base spray deposit, Hv 80 or less for the Cu base spray deposit, Hv 150 or less for the Ni base spray deposit, Hv 250 or less for the Ti base spray deposit, Hv 250 or less for the Mo base spray deposit, and Hv 400 or less for the W base spray deposit. More preferable hardness is Hv 20 or less for the Al base spray deposit, Hv 70 or less for the Cu base spray deposit, Hv 100 or less for the Ni base spray deposit, Hv 200 or less for the Ti base spray deposit, Hv 200 or less for the Mo base spray deposit, and Hv 350 or less for the W base spray deposit.

The Vickers hardness of the spray deposit provided in the present invention denotes a value measured in the following way. That is, first, a surface of the spray deposit 3 is polished to make flat. Next, under a weight of 200 g, a diamond indenter is forced against the flattened surface for 30 sec. Length of an indentation generated thereby is measured in X and Y directions, an average length thereof being converted into the present Vickers hardness. Such measurements are repeated by 5 times, obtained values being averaged to get the present Vickers hardness.

The spray deposit 3 may be configured of one low hardness coat alone of the above low hardness metal spray deposits, or may be configured of a laminate film of two or more of low hardness coats of various metal spray deposits. Furthermore, when the spray deposit 3 is configured of two or more coats, at least one layer of these need only be the low hardness coat.

The spray deposit (low hardness coat) 3 having the above hardness can be obtained for instance by implementing annealing after the spraying to soften. By making the spray deposit 3 sufficiently low in hardness to relieve the internal stress, when the external stress (for instance thermal stress) is applied during the deposition, destruction from the inside of the spray deposit 3 may be effectively suppressed from proceeding. Thereby, the spray deposit 3 itself may be suppressed from peeling. That the hardness of the above metal spray deposits each exceeds the above values each means that the internal stress is not sufficiently relieved. In such spray deposit 3, internal destruction or the proceeding of the peeling based thereon may not be suppressed.

The above metal spray deposits each are not necessarily restricted to a single metal film but can contain an alloy film essentially consisting of the respective metals. However, in view of making the spray deposit 3 lower in hardness, single metal films each, that is, Al spray deposit, Cu spray deposit, Ni spray deposit, Ti spray deposit, Mo spray deposit and W spray deposit, are preferable. More preferable Vickers hardness of these metal spray deposits each is Hv 25 or less for the Al spray deposit, Hv 75 or less for the Cu spray deposit, Hv 150 or less for the Ni spray deposit, Hv 250 or less for the Ti spray deposit, Hv 250 or less for the Mo spray deposit, and Hv 450 or less for the W spray deposit.

As the alloy coats, Al—Cu alloy coat, Al—Ti alloy coat, Cu—Al alloy coat, Cu—Zn alloy coat, Ni—Al alloy coat, Ni—Cr alloy coat, Ti—Al alloy coat, Mo—Ta alloy coat, Mo—W alloy coat and so on can be applied.

The annealing to make the spray deposit 3 lower in hardness, though depending on the formation material of the spray deposit 3, for instance in various kinds of atmospheres such as a vacuum atmosphere, an inert atmosphere and a reducing atmosphere, is preferably implemented at a temperature from 200 to 450° C. for the Al single layer, from 300 to 900° C. for the Cu single layer, from 300 to 900° C. for the Ni single layer, from 300 to 900° C. for the Ti single layer, and from 300 to 1200° C. for the Mo and W single layers.

When the temperature is too low, the internal stress of the spray deposit 3 may not be sufficiently relieved. As a result, the above low hardness may not be attained. On the other hand, when the temperature is too high, thermal deformation may be caused in the component body 2, or the spray deposit 3 may peel. More preferable annealing temperatures of the metal spray deposits are from 250 to 350° C. for the Al single layer, from 600 to 800° C. for the Cu single layer, from 450 to 750° C. for the Ni single layer, from 350 to 650° C. for the Ti single layer, and from 600 to 900° C. for the Mo and W single layers.

When the spray deposit 3 is configured of a laminate of two or more coats, based on a temperature of low melting point material, the annealing is preferably implemented. The preferable annealing temperature of the spray deposit 3 of laminate structure is different depending on the material being used. Table 1 shows typical examples of the preferable annealing temperatures for the spray deposits 3 of the laminate structure.

TABLE 1

| Spray Deposit of Laminate Structure | | Annealing Temperature (° C.) | |
|---|---|---|---|
| Stress Relief Layer | Thermal Expansion Relief Layer | Preferable Range of Temperature (° C.) | More Preferable Range of Temperature (° C.) |
| Al | Cu | 200~450 | 350~450 |
| Al | Ti | 200~450 | 350~450 |
| Al | W  | 200~450 | 350~450 |
| Al | Mo | 200~450 | 350~450 |
| Al | Ni | 200~450 | 350~450 |
| Cu | Al | 200~450 | 350~450 |
| Cu | Ti | 300~900 | 600~800 |
| Cu | W  | 300~900 | 600~800 |
| Cu | Mo | 300~900 | 600~800 |
| Cu | Ni | 300~900 | 500~800 |
| Ni | Al | 200~450 | 350~450 |
| Ni | Cu | 300~900 | 500~800 |
| Ni | Ti | 300~900 | 600~800 |
| Ni | W  | 300~900 | 600~800 |
| Ni | Mo | 300~900 | 600~800 |

In the spray deposit 3 based on the above second apparatus component, the low hardness coat (spray deposit of low hardness metal) in which the internal stress is relieved is applied. Accordingly, the spray deposit 3 itself may be effectively suppressed from peeling. Furthermore, by making the spray deposit 3 lower in hardness, the internal stress of the deposition material (adhered film) adhered thereon also may be relieved. As a result, the adhered film itself on the spray deposit 3 may be suppressed from peeling.

Thereby, the number of the apparatus cleaning or of exchange of components due to the peeling of the spray deposit 3 or the adhered film piled thereon may be largely reduced. In other words, the life of the apparatus component 1 may be largely elongated. Thus, by making longer the life of the apparatus component 1, an improvement of the working efficiency of the deposition apparatus, resultantly the reduction of the deposition cost may be realized. Furthermore, the dust generation due to the peeling of the spray deposit 3 or the adhered film thereon may be suppressed. Accordingly, the yield of the various kinds of films formed by means of the vacuum deposition apparatus and of elements or components therewith may be heightened.

The component 1 for vacuum deposition apparatus of the present invention is particularly preferable to have together the configurations of the above first and second apparatus components. That is, the spray deposit 3 that is controlled in the surface roughness and has the above low hardness coat is preferably applied in the component 1 for vacuum deposition apparatus. Such present component 1 for vacuum deposition apparatus may heighten the yield of the various kinds of films or the elements therewith. In addition to the above, the number of the apparatus cleaning and the component exchange may be largely reduced.

Figure 4:
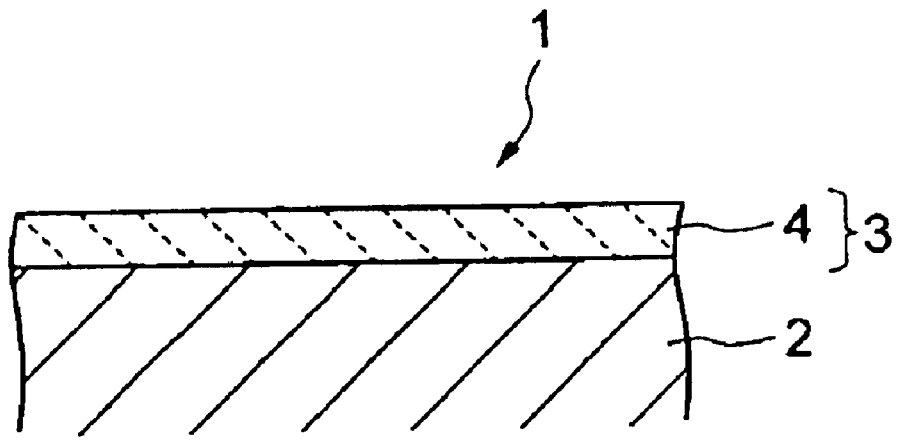
FIG. 4 is a sectional view showing schematically a configuration of a first specific example of a spray deposit in a component for the vacuum deposition apparatus shown in FIG. 1.
Figure 5:
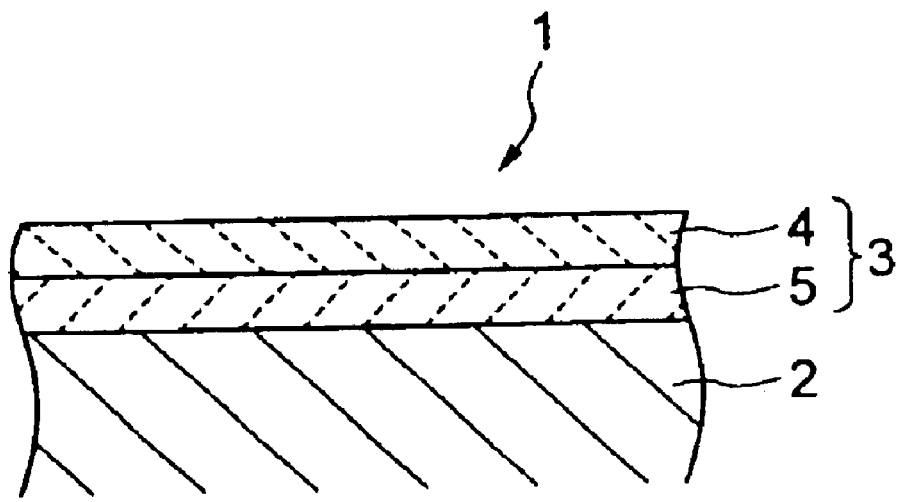
FIG. 5 is a sectional view showing schematically a configuration of a second specific example of a spray deposit in a component for the vacuum deposition apparatus shown in FIG. 1.

In the first and second apparatus components of the present invention, as the specific configuration of the spray deposit 3, structures shown in FIGS. 4 and 5 can be cited. In FIG. 4, the spray deposit 3 is configured of the thermal expansion relief layer 4 alone comprising metal of which difference of the thermal expansion coefficient from that of the deposition material is $15 \times 10^{-6}$/K or less. In FIG. 5, the spray deposit 3 is configured by a laminate of the stress relief layer 5 comprising soft metal and the thermal expansion relief layer 4 comprising metal of which difference of the thermal expansion coefficient from that of the deposition material is $15 \times 10^{-6}$/K or less. In the laminate spray deposit 3 shown in FIG. 5, the stress relief layer 5 is disposed as the underlayer of the thermal expansion relief layer 4, being interposed between the component body 2 and the thermal expansion relief layer 4.

When the spray deposit 3 is configured by a laminate of the stress relief layer 5 and the thermal expansion relief layer 4, the thickness of the thermal expansion relief layer 4 is preferable to be in the range from 50 to 150 $\mu$m, that of the stress relief layer 5 being preferable to be in the range from 100 to 300 $\mu$m. The total thickness of the spray deposit 3 is as mentioned above. When the thickness of the thermal expansion relief layer 4 is less than 50 $\mu$m, the function thereof may not be sufficiently exhibited. Furthermore, when the thickness of the stress relief layer 5 is less than 100 $\mu$m, the function thereof may not be sufficiently exhibited. However, when one of the thermal expansion relief layer 4 and the stress relief layer 5 is made too thick, the other thickness becomes thinner relatively. Accordingly, the thickness of the thermal expansion relief layer 4 is preferable to be 150 $\mu$m or less, that of the stress relief layer 5 being preferable to be 300 $\mu$m or less.

The kind of the metal configuring the spray deposit 3 is appropriately selected according to the usage thereof. For instance, when applying the low hardness coat in the thermal expansion relief layer 4 shown in FIGS. 4 or 5, in accordance with the kind of the deposition material (adhered film), Al base spray deposit, Cu base spray deposit, Ti base spray deposit, Ni base spray deposit, Mo base spray deposit or W base spray deposit is appropriately selected to use. Thus, though the thermal expansion relief layer 4 is preferably configured from the above low hardness coating, material and hardness other than the above may be applied.

According to the thermal expansion relief layer 4 formed of the low hardness coat, in addition to an effect of suppressing the peeling due to the relief of its own internal stress, an effect of relieving the internal stress of the deposition material (adhered film) adhered thereon may be expected. That is, when the deposition material keeps adhering on the spray deposit 3 to pile up, therein the stress is generated. The internal stress generated during the adhering and piling up of the deposition material may be relieved by making the hardness of the spray deposit 3 lower. Accordingly, the adhered film itself on the spray deposit 3 may be suppressed from peeling.

Furthermore, also in the stress relief layer 5 formed of the soft metal, it is preferable to apply the present low hardness coat. As the low hardness coat applicable in the stress relief layer 5, the Al base spray deposit of Vickers hardness of Hv 30 or less, the Cu base spray deposit of Vickers hardness of Hv 100 or less, and the Ni base spray deposit of Vickers hardness of Hv 200 or less can be cited. By applying these low hardness coat in the stress relief layer 5, the stress relief effect due to the soft metal may be furthermore heightened.

The metal film configuring the spray deposit 3, without restricting to the above low hardness coats, can be one of for instance Ta base or Fe base alloy (for instance stainless steel). Furthermore, when applying the spray deposit 3 in other functional layers than the thermal expansion relief layer 4 or the stress relief layer 5, depending on the usage thereof, suitable metal is selected to use.

The above apparatus component 1 of the present invention is used as a component for a vacuum deposition apparatus such as a sputtering apparatus or a CVD apparatus. The apparatus component 1 is applicable to any kinds of components to which the deposition material adheres during the deposition. Furthermore, the metal configuring the spray deposit 3 of the apparatus component 1, in accordance with the deposition apparatus or the deposition process to be applied, can be appropriately selected to use.

For instance, in the process of manufacturing a semiconductor element, when a barrier film of Ti base is deposited, a laminate of Al base spray deposit 5/Ti base spray deposit 4, a single layer of Ti spray deposit 4 or the like may be used. When a Ta base underlayer is deposited by means of the sputtering, a single layer of Cu base spray deposit 4 or the like is used. When a WSi$_x$ electrode is deposited by means of the sputtering, a laminate of Al base spray deposit 5 and W base spray deposit 4 or the like is used. When an Al interconnection is deposited by means of the sputtering, a single layer of Al base spray deposit 5 is used. Similarly, in the manufacturing process of a liquid crystal display element, when various kinds of electrode films or interconnection films are deposited by means of the sputtering, a single layer of Al base spray deposit 5 or the like is used.

The deposition process therein the present component for vacuum deposition apparatus is applicable, without restricting to the manufacturing process of the semiconductor element or the liquid crystal display element, is also applicable to manufacturing processes of various kinds of recording media or heads for recording and writing, of electronic components such as thin film condensers or resistors, and of glass components.

Furthermore, the present apparatus component 1 is also applicable to a CVD apparatus. As the specific example where the present apparatus component 1 is applied in the CVD apparatus, an electrode for CVD on the surface of which the spray deposit is formed can be cited. In an electrode for CVD that is used for depositing an amorphous Si film for instance, on the surface thereof an Al spray deposit or the like is coated to use. In such Al base spray deposit, a configuration of the present invention can be applied.

In the above embodiment, examples where the present invention was applied in the components for vacuum deposition apparatus were explained. However, the spray deposit due to the present invention is also applicable to a target apparatus. That is, in the case of the spray deposit being coated in a non-erosion area of the target body, or even in the case of the spray deposit being coated on a surface of the backing plate body for holding the target, the spray deposit having the above configuration can be applied.

Figure 6:
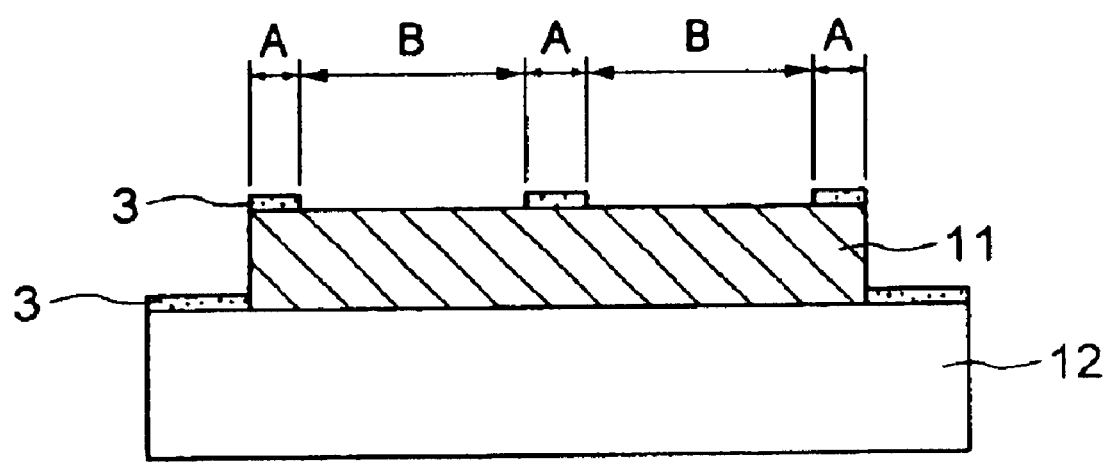
FIG. 6 is a sectional view showing a rough configuration of one embodiment of a sputtering target therein a present target device is applied.

FIG. 6 is a diagram showing a rough configuration of a target apparatus according to one embodiment of the present invention. The target apparatus shown in the figure comprises a target body 11 and a backing plate 12 for holding the target body 11. A center and periphery of the target body 11 are not substantially sputtered to be a non-erosion area A. An area B shows an erosion area.

In the non-erosion area A of the above target body 11, sputtered particles adhere again. Even when an accretion of such non-erosion area A peels, similarly with the peeling of an accretion from other components, it can be a cause of failure of an interconnection film. Accordingly, in the non-erosion area A of the target body 11, the spray deposit 3 having the configuration, material, hardness, surface roughness, thickness or the like, all of which are explained in the above implementation mode of the component for vacuum deposition apparatus, is formed. Thus, by forming in advance, in the non-erosion area A of the target body 11, the spray deposit 3 according to the present invention, interconnection failure or element failure accompanying the peeling of the accretion may be suppressed from occurring.

Furthermore, also on an exposed surface of the backing plate 12, the sputtered particles adhere again. To such exposed surface of the backing plate 12, by forming in advance the spray deposit 3 according to the above present invention, interconnection failure or element failure accompanying the peeling of the accretion may be suppressed from occurring. The backing plate comprises the backing plate body 12 and the spray deposit 3 formed on the exposed surface thereof.

Figure 7:
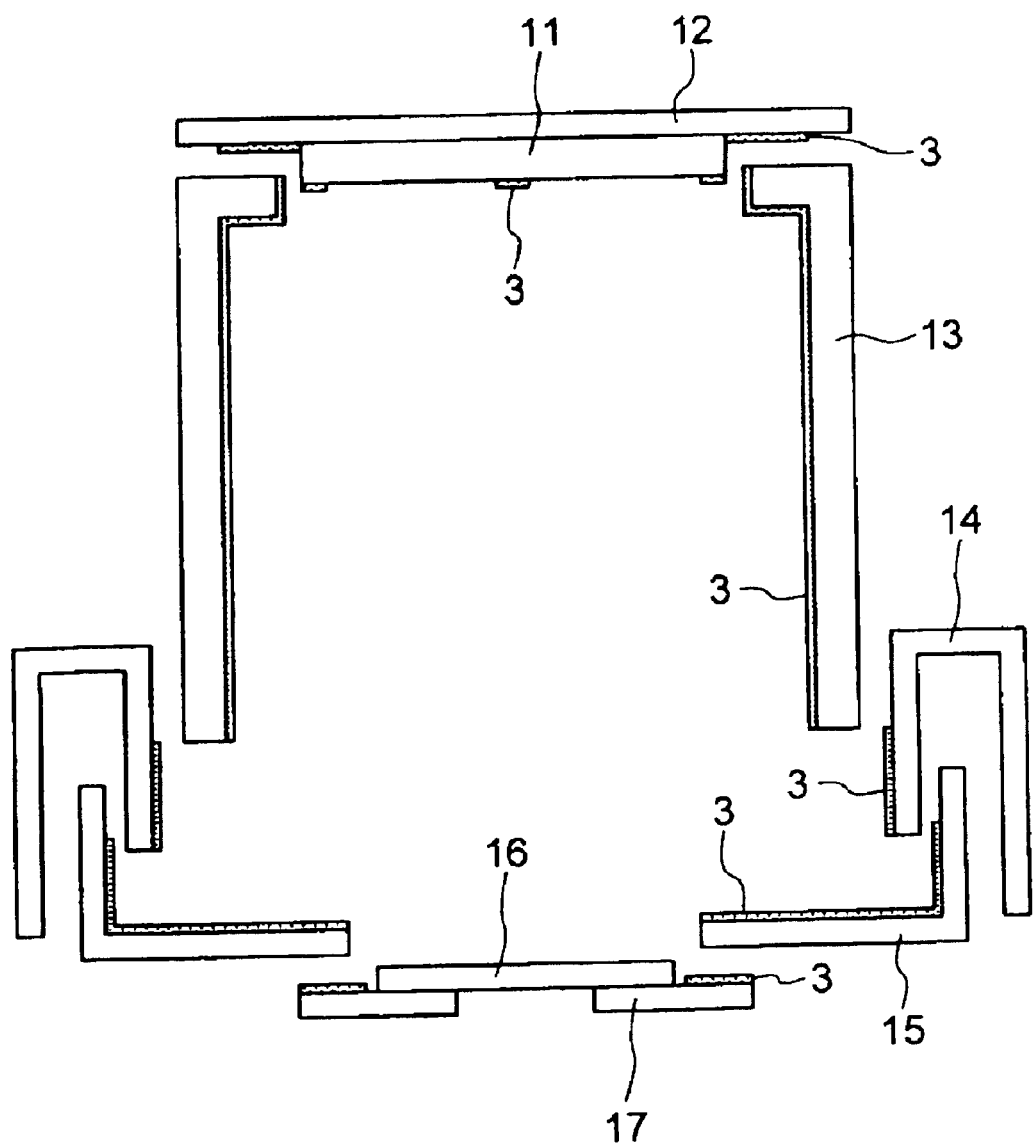
FIG. 7 is a diagram showing an essential configuration of one embodiment of a sputtering target therein the present vacuum deposition apparatus is applied.

Next, a mode for implementing the present vacuum deposition apparatus will be explained. FIG. 7 is a diagram showing an essential configuration of one implementation mode where the present vacuum deposition apparatus is applied in the sputtering apparatus. In the same figure, reference numeral 11 denotes a sputtering target held to the backing plate 12. Below the periphery of the sputtering target 11 as the deposition material source, there is disposed an earth shield 13. Below the earth shield 13, there are further disposed an upper deposition preventive plate 14 and a lower deposition preventive plate 15.

A substrate 16 that is a sample to be deposited is held facing the sputtering target 11 by a platen ring 17 that is a holder of the sample to be deposited. These are disposed in a vacuum chamber omitted from showing in the figure. To the vacuum chamber, a gas feed unit (not shown in the figure) and an exhausting unit (not shown in the figure) for evacuating the vacuum chamber to a prescribed vacuum are connected.

In the sputtering apparatus of the implementation mode, the earth shield 13, the upper deposition preventive plate 14, the lower deposition preventive plate 15 and the platen ring 17 are configured of the above component 1 for vacuum deposition apparatus of the present invention. The specific configuration of the component 1 for vacuum deposition apparatus is as mentioned above. Furthermore, in the implementation mode, in the non-erosion area of the sputtering target 11, the identical spray deposit 3 is disposed. Also on the exposed surface of the backing plate 12, the similar spray deposit 3 is disposed. The spray deposits 3 all are formed on surfaces where the particles sputtered from the sputtering target 11 adhere.

In the above sputtering apparatus, in the deposition process, on the surfaces of the earth shield 13, the upper deposition preventive plate 14, the lower deposition preventive plate 15, the platen ring 17, the sputtering target 11 and the backing plate 12, the sputtered deposition material (constituent material of the target 11) adhere. However, the spray deposit 3 on the surfaces of the components may stably and effectively suppress the peeling of the accretion. Furthermore, the spray deposit 3 itself is stable to survive longer.

Thereby, an amount of generation of dust and particles, and further an amount thereof mingling in the film formed on the substrate 16 may be largely suppressed. Accordingly, the manufacture yield of semiconductor elements of high integration such as 64M, 256M, 1G and of liquid crystal display elements may be remarkably improved. That is, even in an interconnection film of which interconnection width is such narrow as 0.2 μm or less and that forms an interconnection network of high density, fine particles (for instance 0.2 μm or less in diameter) may be largely suppressed from mingling. Accordingly, the interconnection failure may be largely reduced. Thereby, an element yield may be improved.

Furthermore, since the accretion and the spray deposit 3 itself may be stably and effectively suppressed from peeling, the number of times of apparatus cleaning or of component exchange may be largely reduced. Based on the reduction of the number of times of the apparatus cleaning or the component exchange, the working efficiency of the sputtering apparatus may be improved. That is, running cost of the sputtering apparatus may be reduced, resulting in the decrease of the deposition cost of the various kinds of thin films.

In the above implementation mode, an example where the earth shield 13, the upper deposition preventive plate 14, the lower deposition preventive plate 15, the platen ring 17, the sputtering target 11 and the backing plate 12 are configured from the present component, is explained. However, other than these, a target periphery hold (not shown in the figure), a shutter (not shown in the figure) or the like may be effectively configured of the present component for vacuum deposition apparatus. Furthermore, other than the above components, in any components in which the deposition material adheres unavoidably in the course of the deposition, the present component for vacuum deposition apparatus may effectively function.

Thus, the present vacuum deposition apparatus, by configuring at least one selected from a holder of a sample to be deposited, a holder of a deposition material source and a preventive component from the present component for vacuum deposition apparatus, may exhibit the above excellent effects. Furthermore, also when the present invention is applied in the target and the backing plate, the similar effects may be exhibited.

In the above implementation mode, the vacuum deposition apparatus of the present invention is applied in the sputtering target to explain. However, other than this, the present vacuum deposition apparatus is also applicable in a vacuum evaporator (including ion plating and laser ablation), the CVD apparatus or the like, thereby effects identical with the sputtering apparatus may be obtained.

In the following, specific embodiments of the present invention will be explained.

COMPARATIVE EXAMPLE 1

Embodiment 1

In the first place, by means of the plasma spraying, on a surface of SUS 304 substrate, an Al spray deposit of a thickness 250 μm and a Ti spray deposit of a thickness 100 μm are coated in turn to prepare the earth shield 13, the upper deposition preventive plate 14, the lower deposition preventive plate 15 and the platen ring 17 of the sputtering apparatus shown in FIG. 7. With the components each, a magnetron sputtering apparatus is configured.

Al spraying, with Al spray raw material of which average particle diameter of powder is 52 μm, is implemented under the conditions of a current of 500 A and a voltage of 80 V. Ti spraying, with Ti spray raw material of which average particle diameter of powder is 65 μm, is implemented under the conditions of a current of 500 A and a voltage of 65 V. Each atmosphere during the spraying is a mixture of Ar and $H_2$, Ar being fed by 73L/min, $H_2$ being fed by 8L/min. For components each, after cleansing a surface of the Ti spray deposit, heat treatment is implemented in a vacuum under the conditions of 350° C.×3 hr to anneal and degas.

The surface roughness of the Ti spray deposit is 83 μm for the mean spacing S of tops of local peak of profile, 36 μm for the distance from the mean line to the bottom of profile valley line Rv and 42 μm for the distance from the mean line to the top of profile peak line Rp. The surface roughness values are ones obtained by measuring in terms of surface roughness tester S4C of Taylor-Boblin Co. Furthermore, the hardness values of the spray deposits each after annealing are Hv 20 for the Al spray deposit and Hv 230 for the Ti spray deposit.

In such magnetron sputtering apparatus, a high purity Ti target 11 is set up for implementing magnetron sputtering, thereby in the first place, on a 8-inch wafer, a Ti thin film being deposited. Furthermore, thereon magnetron sputtering is applied while introducing $N_2$ gas, thereby a TiN thin film being deposited. A surface state of the obtained Ti/TiN thin film, when observing enlarged by means of an electron microscope, is found to be in excellent shape. Furthermore, the number of the particles of which diameter is 0.2 μm or more on the Ti/TiN thin film is measured. Such procedures are continuously implemented to find out variation of the number of the particles. The results are shown in FIG. 8.

On the other hand, as a comparative Example with the present invention, the respective components similar with the above Embodiment 1 are prepared in the following ways. In the first place, on a surface of SUS 304 substrate, an Al spray deposit of a thickness 100 μm is coated by means of electric arc spraying, and furthermore a Ti spray deposit of a thickness 250 μm being coated by means of plasma spraying. By the use of the components each, a magnetron sputtering apparatus is configured. The components each, after cleansing the surface of the Ti spray deposit, are assembled in the magnetron sputtering apparatus. Furthermore, the surface roughness of the Ti spray deposit is 126 μm for the mean spacing S of tops of local peak of profile, 75 μm for the distance from the mean line to the bottom of profile valley line Rv and 85 μm for the distance from the mean line to the top of profile peak line Rp. The hardness values of the spray deposits each are Hv 35 for the Al spray deposit and Hv 380 for the Ti spray deposit.

With the magnetron sputtering apparatus according to the above Comparative Example 1, similarly with Embodiment 1, Ti/TiN thin films are deposited on 8-inch wafers and the variation of the number of the particles is checked. The results are shown together in FIG. 8. Furthermore, a surface state of the Ti/TiN film of Comparative Example 1 is enlarged by means of the electron microscope to observe, being found to be inferior to that of Embodiment 1.

Figure 8:
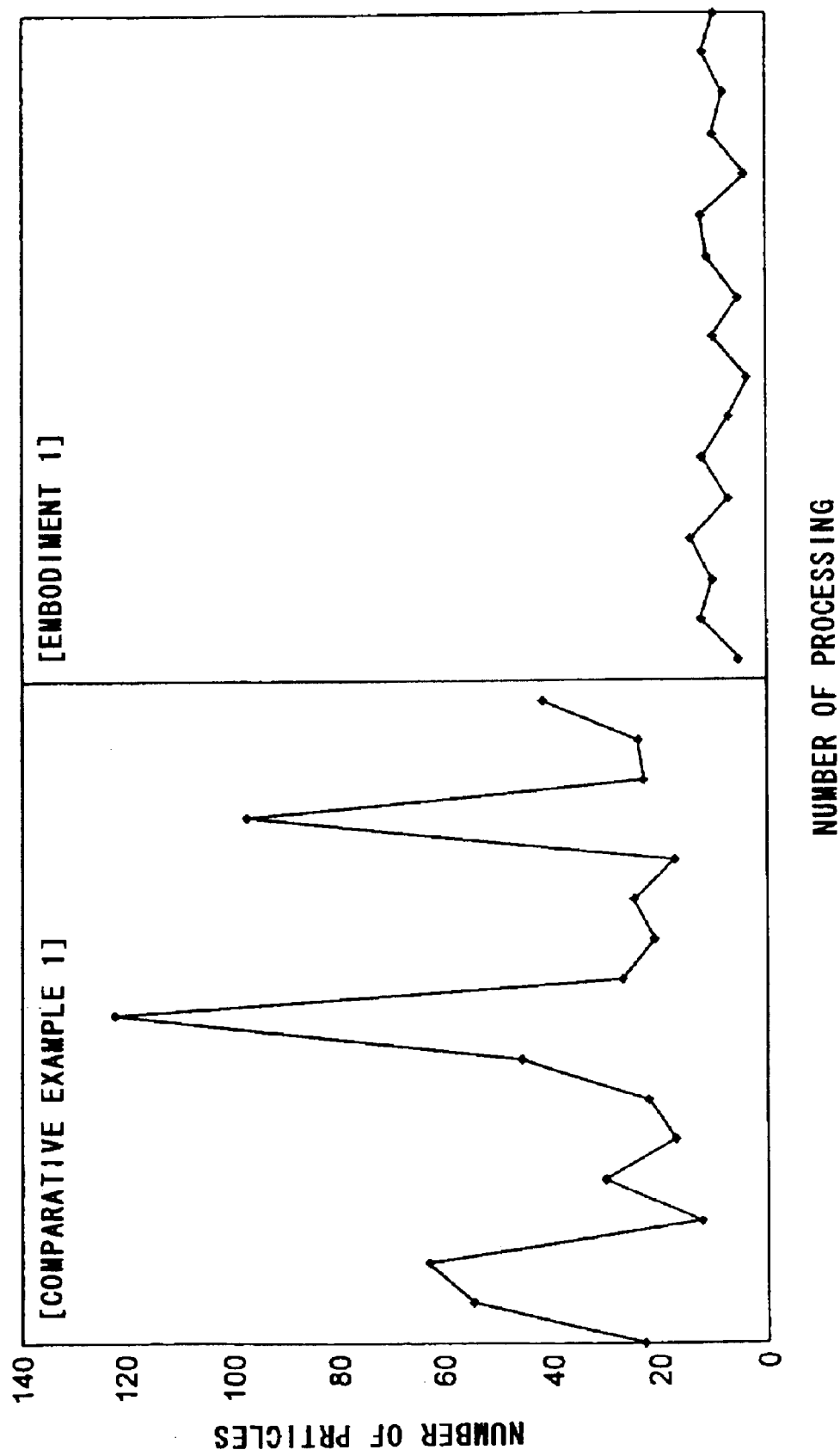
FIG. 8 is a diagram showing variation of the number of particles when a sputtering apparatus according to Embodiment 1 of the present invention is used in comparison with that of a sputtering apparatus of Comparative Example 1.

As obvious from FIG. 8, in the magnetron sputtering apparatus due to Embodiment 1, the amount of the generated particles is low with stability up to 150 lots. On the other hand, in the magnetron sputtering apparatus according to Comparative Example 1, it is found that in addition to there being sporadic particle generation, overall amount of the generated particles is larger. From these, it is found that by the use of the spray deposit according to Embodiment 1, the particles may be effectively and stably suppressed from generating.

COMPARATIVE EXAMPLE 2
Embodiment 2

Similarly with the above embodiment 1, with the respective components in which a laminate film of the Al spray deposit and the Ti spray deposit shown in Table 2 is formed, the magnetron sputtering apparatuses are configured, respectively. The surface roughness of the outermost surface and hardness of each spray deposit are as shown in Table 2. The surface roughness of the spray deposit is adjusted by means of the particle diameter of powder. The hardness of the spray deposit is adjusted due to the annealing condition.

With the magnetron sputtering apparatuses each, similarly with Embodiment 1, on 8-inch wafers, Ti/TiN thin films are formed and the numbers of particles of which particle diameter is 0.2 μm or more on the Ti/TiN thin films are measured. The thin film deposition process is continued. In terms of the number of lots where the number of the particles starts increasing, the life until the peeling occurs is checked. Furthermore, average values each of the numbers of the particles based on 150 lots are checked. The results are shown in Table 2.

TABLE 2

| | No. | Spray Deposit (Material/Thickness μm) LL | UL | Annealing Conditions (° C. × hr) | Surface Roughness (μm) S | Rv | Rp | Hardness (Hv) LL | UL | Result of Evaluation TF | PL | NP |
|---|---|---|---|---|---|---|---|---|---|---|---|---|
| EMBODIMENT 2 | 1 | Al/ 255 | Ti/ 103 | 350 × 3 | 78 | 39 | 40 | 25 (Al) | 263 (Ti) | Ti/ TiN | 155 | 13 |
| | 2 | Al/ 206 | Ti/ 77 | 300 × 3 | 83 | 52 | 49 | 28 (Al) | 277 (Ti) | Ti/ TiN | 124 | 16 |
| | 3 | Al/ 248 | Ti/ 95 | 350 × 5 | 81 | 42 | 40 | 22 (Al) | 252 (Ti) | Ti/ TiN | 161 | 14 |
| | 4 | Al/ 247 | Ti/ 104 | 350 × 3 | 83 | 44 | 45 | 25 (Al) | 264 (Ti) | Ti/ TiN | 153 | 17 |
| | 5 | Al/ 199 | Ti/ 82 | 350 × 3 | 79 | 50 | 47 | 26 (Al) | 259 (Ti) | Ti/ TiN | 139 | 15 |
| | 6 | Al/ 115 | Ti/ 238 | — | 72 | 43 | 42 | 37 (Al) | 385 (Ti) | Ti/ TiN | 87 | 42 |
| | 7 | Al/ 110 | Ti/ 243 | — | 73 | 43 | 45 | 36 (Al) | 388 (Ti) | Ti/ TiN | 83 | 45 |
| | 8 | Al/ 263 | Ti/ 97 | 350 × 3 | 158 | 83 | 78 | 24 (Al) | 265 (Ti) | Ti/ TiN | 148 | 29 |
| CE 2 | 9 | Al/ 103 | Ti/ 255 | — | 161 | 88 | 86 | 38 (Al) | 394 (Ti) | Ti/ TiN | 62 | 65 |
| | 10 | Al/ 115 | Ti/ 235 | — | 173 | 89 | 90 | 39 (Al) | 385 (Ti) | Ti/ TiN | 64 | 71 |
| | 11 | Al/ 197 | Ti/ 82 | — | 162 | 80 | 77 | 42 (Al) | 385 (Ti) | Ti/ TiN | 73 | 56 |
| | 12 | Al/ 188 | Ti/ 96 | — | 174 | 82 | 84 | 40 (Al) | 377 (Ti) | Ti/ TiN | 86 | 64 |

CE: Comparative Example,
LL: Lower Layer,
UL: Upper Layer,
TF: Thin Film,
PL: Peeling (lot),
NP: Number of Particle (pieces)

COMPARATIVE EXAMPLE 3
Embodiment 3

Firstly, a plurality of Ti raw materials of which particle diameters are in the range from 40 to 150 μm and that are different in particle diameter distributions are prepared as raw materials for spraying. With the Ti raw materials for spraying, to the components (SUS304 substrate) each of the earth shield 13, the upper deposition preventive plate 14, the lower deposition preventive plate 15 and the platen ring 17 of the sputtering apparatus shown in FIG. 7, Ti spray deposit of a thickness of 200 μm is coated by means of the plasma flame spraying. Secondly, the surface of the Ti spray deposit, after cleansing, is heat treated in a vacuum under the conditions of from 300 to 500° C.×3 hr. The surface roughness of each Ti spray deposit is as shown in Table 3.

Thirdly, the components each are assembled in the magnetron sputtering apparatus, similarly with Embodiment 1, Ti/TiN thin film being deposited on a 8-inch wafer. The number of the particles of which diameter is 0.2 μm or more is measured on the Ti/TiN thin film. The thin film deposition process is continued up to 150 lots to get an average value of the numbers of the particles. The results are shown in Table 3. In Comparative Example 3 in Table 3, with the exception of the use of electric arc spraying in the formation of the Ti spray deposit, the similar components are employed.

TABLE 3

| | Sample No. | Surface Roughness of Ti Spray Deposit | | | Number of Particles (pieces/ one lot) |
|---|---|---|---|---|---|
| | | S (μm) | Rv (μm) | Rp (μm) | |
| Embodiment 3 | 1 | 55 | 25 | 22 | 14 |
| | 2 | 68 | 32 | 26 | 13 |
| | 3 | 85 | 40 | 32 | 8 |
| | 4 | 107 | 42 | 33 | 16 |
| | 5 | 136 | 52 | 55 | 18 |
| | 6 | 146 | 63 | 68 | 24 |
| Comparative Example 3 | 7 | 38 | 17 | 15 | 53 |
| | 8 | 170 | 85 | 90 | 61 |

As obvious from Table 3, it is found that in the magnetron sputtering apparatuses according to Embodiment 3, the numbers of the generated particles are extremely less than that of Comparative Example 3. Accordingly, the yield of the films (Ti/TiN thin films) may be largely heightened.

COMPARATIVE EXAMPLE 4

Embodiment 4

A plurality of Al raw materials of which particle diameters are in the range from 40 to 120 μm and that are different in particle diameter distributions are prepared as raw materials for spraying. With the Al raw materials for spraying, to the components (SUS304 substrate) each of the earth shield 13, the upper deposition preventive plate 14, the lower deposition preventive plate 15 and the platen ring 17 of the sputtering apparatus shown in FIG. 7, Al spray deposit of a thickness of 200 μm is coated by means of the plasma spraying. Then, each surface of the Al spray deposits, after cleansing, is heat treated in a vacuum under the conditions from 300 to 500° C.×3 hr. The surface roughness of each Al spray deposit is as shown in Table 4.

Next, the components each are assembled in the magnetron sputtering apparatus with a high purity tungsten silicide ($WSi_{2.8}$) target, $WSi_x$ thin films being deposited on 8-inch wafers. The number of the particles of which diameter is 0.2 μm or more is measured on the $WSi_x$ thin film. The thin film deposition process is continued up to 200 lots to get an average value of the numbers of the particles. The results are shown in Table 4. In Comparative Example 4 in Table 4, with the exception of the use of electric arc spraying in the formation of the Al spray deposit, the similar components are employed.

TABLE 4

| | Sample No. | Surface Roughness of Al Spray Deposit | | | Number of Particles (pieces/ one lot) |
|---|---|---|---|---|---|
| | | S (μm) | Rv (μm) | Rp (μm) | |
| Embodiment 4 | 1 | 58 | 24 | 22 | 13 |
| | 2 | 74 | 27 | 20 | 11 |

TABLE 4-continued

| | Sample No. | Surface Roughness of Al Spray Deposit | | | Number of Particles (pieces/ one lot) |
|---|---|---|---|---|---|
| | | S (μm) | Rv (μm) | Rp (μm) | |
| | 3 | 89 | 43 | 36 | 9 |
| | 4 | 110 | 47 | 38 | 15 |
| | 5 | 131 | 59 | 55 | 12 |
| | 6 | 145 | 67 | 68 | 15 |
| Comparative Example 4 | 7 | 33 | 18 | 16 | 42 |
| | 8 | 175 | 96 | 88 | 74 |

As obvious from Table 4, it is found that in the magnetron sputtering apparatuses according to Embodiment 4, the numbers of the generated particles are extremely less than that of Comparative Example 4. Accordingly, the yield of the films ($WSi_x$ thin films) may be largely heightened.

COMPARATIVE EXAMPLE 5

Embodiment 5

A plurality of Ti raw materials of which particle diameters are in the range from 40 to 150 μm and that are different in particle diameter distributions are prepared as raw materials for spraying. With the Ti raw materials for spraying, to the components (SUS304 substrate) each of the earth shield 13, the upper deposition preventive plate 14, the lower deposition preventive plate 15 and the platen ring 17 of the sputtering apparatus shown in FIG. 7, Al spray deposit of a thickness of 200 μm is coated by means of the plasma spraying, followed by the coating of Ti spray deposit of a thickness of 80 μm by means of the plasma spraying. Then, the surface of the Ti spray deposit, after cleansing, is heat treated in a vacuum under the conditions form 300 to 500° C.×3 hr. The hardness of each Ti spray deposit is as shown in Table 5.

Next, the components each are assembled in the magnetron sputtering apparatus, similarly with Embodiment 1, Ti/TiN thin films being deposited on 8-inch wafers. The thin film deposition process is continued, in terms of the number of lots where the number of the particles starts increasing, the life when the peeling occurs in checked. The results are shown in Table 5. In Comparative Example 5in Table 5, with the exception for the annealing being not implemented, the similar components are

TABLE 5

| | Sample No. | Hardness of Al Spray Deposit (Hv) | Hardness of Ti Spray Deposit (Hv) | Peeling Life (Number of Lots) |
|---|---|---|---|---|
| Embodiment 5 | 1 | 28 | 288 | 130 |
| | 2 | 25 | 263 | 155 |
| | 3 | 22 | 237 | 170 |
| | 4 | 20 | 205 | 177 |
| | 5 | 18 | 182 | 182 |
| | 6 | 17 | 165 | 197 |
| Comparative Example 5 | 7 | 37 | 369 | 85 |
| | 8 | 46 | 394 | 63 |

As obvious m Table 5, it is found that in the magnetron sputtering apparatuses according to Embodiment 5, the numbers of lots where the generation of the particles starts abruptly increasing, that is, the peeling life is long, resulting in longer and stable use. That means that the working efficiency of the sputtering apparatus may be heightened, resulting in largely contributing in the reduction of running cost of the apparatus and deposition cost.

COMPARATIVE EXAMPLE 6
Embodiment 6

A plurality of Al raw materials of which particle diameters are in the range from 40 to 120 μm and that are different in particle diameter distributions are prepared as raw materials for spraying. With the Al raw materials for spraying, to the components (SUS304 substrate) each of the earth shield 13, the upper deposition preventive plate 14, the lower deposition preventive plate 15 and the platen ring 17 of the sputtering apparatus shown in FIG. 7, Al spray deposit of a thickness of 200 μm is coated by means of the plasma spraying, further thereon W spray deposit of a thickness of 100 μm being coated by means of plasma spraying. Then, the surface of the W spray deposit, after cleansing, is heat treated in a vacuum under the conditions from 300 to 500° C.×3 hr. The hardness of each spray deposit is shown in Table 6.

Next, the above components each are assembled in the magnetron sputtering apparatus with a high purity tungsten silicide ($WSi_{2.8}$) target, $WSi_x$ thin films being deposited on 8-inch wafers. The deposition of the $WSi_x$ thin films is continued while measuring the number of the particles of which diameter is 0.2 μm or more. In terms of the number of lots where the number of the particles starts increasing, the life until the peeling occurs is checked. The results are shown in Table 6. In Comparative Example 6 in Table 6, with the exception of the annealing being not implemented, the components in which the similar spray deposits are coated are employed.

TABLE 6

| | Sample No. | Hardness of Al Spray Deposit (Hv) | Hardness of W Spray Deposit (Hv) | Peeling Life (Number of Lots) |
|---|---|---|---|---|
| Embodiment 6 | 1 | 27 | 455 | 278 |
| | 2 | 25 | 432 | 282 |
| | 3 | 23 | 421 | 297 |
| | 4 | 21 | 405 | 313 |
| | 5 | 19 | 398 | 326 |
| | 6 | 17 | 364 | 338 |
| Comparative Example 6 | 7 | 39 | 532 | 184 |
| | 8 | 47 | 580 | 167 |

As obvious from Table 6, it is found that in the magnetron sputtering apparatuses according to Embodiment 6, the numbers of the lots where the number of the particles starts increasing, that is, the peeling life is longer, resulting in longer and stable use. This means that the working efficiency of the sputtering apparatus may be heightened, resulting in largely contributing in the reduction of the running cost of the apparatus and furthermore in the reduction of the deposition cost.

Embodiment 7

To the components (SUS304 substrate) each of the earth shield 13, the upper deposition preventive plate 14, the lower deposition preventive plate 15 and the platen ring 17 of the sputtering apparatus shown in FIG. 7, spray deposits each shown in Table 7 are coated by means of the plasma spraying. Then, the surface of the spray deposits each, after cleansing, is heat treated under the conditions shown in Table 7. The surface roughness and hardness of each spray deposit are shown in Table 7.

The conditions of coating (conditions for plasma spraying) of the spray deposits each are, for Al, a particle diameter of powder raw material from 45 to 90 μm, an electric current 500 A, a voltage 75 V, an Ar flow rate 73 L/min and a $H_2$ flow rate 8 L/min; for Cu, a particle diameter of powder raw material from 30 to 90 μm, an electric current 500 A, a voltage 65 V, an Ar flow rate 73 L/min and a $H_2$ flow rate 5 L/min; for W, a particle diameter of powder raw material of 45 μm or less, an electric current 500 A, a voltage 65 V, an Ar flow rate 39 L/min and a $H_2$ flow rate 10 L/min; for Mo, a particle diameter of powder raw material of 45 μm or less, an electric current 500 A, a voltage 67 V, an Ar flow rate 39 L/min and a $H_2$ flow rate 12 L/min; for Ni, a particle diameter of powder raw material from 45 to 75 μm, an electric current 500 A, a voltage 60 V, an Ar flow rate 39 L/min and a $H_2$ flow rate 6.5 L/min; for Ta, a particle diameter of powder raw material from 30 to 80 μm, an electric current 550 A, a voltage 68 V, an Ar flow rate 39 L/min and a $H_2$ flow rate 12 L/min. For SUS304, a particle diameter of powder raw material is from 40 to 90 μm, an electric current is 500 A, a voltage is 65 V, an Ar flow rate is 39 L/min and a $H_2$ flow rate is 10 L/min for Al.

Next, the components each are assembled in the magnetron sputtering apparatus, on 8-inch wafers, thin films shown in Table 7 are formed. The number of particles of which particle diameter is 0.2 μm or more on each thin film is measured. The thin film deposition process is continued. In terms of the number of lots where the number of the particles starts increasing, the life until the peeling occurs is checked. Furthermore, average values of the numbers of the particles based on 150 lots are checked.

The results are shown in Table 7.

TABLE 7

| | No. | Spray Deposit M | T (μm) | Annealing Conditions (° C. × hr) | Surface Roughness (μm) S | Rv | Rp | Hardness (Hv) | Result of Evaluation TF | PL | NP |
|---|---|---|---|---|---|---|---|---|---|---|---|
| EMBODIMENT 7 | 1 | Al | 235 | 400 × 3 | 65 | 40 | 38 | 18 | Al | 459 | 21 |
| | 2 | Cu | 250 | 700 × 3 | 95 | 58 | 49 | 57 | Ti/TiN | 163 | 14 |
| | 3 | Cu | 243 | 750 × 3 | 97 | 64 | 58 | 50 | Ti/TiN | 184 | 25 |
| | 4 | W | 233 | 800 × 2 | 72 | 45 | 40 | 420 | WSix | 223 | 33 |
| | 5 | W | 245 | 850 × 2 | 78 | 50 | 47 | 403 | WSix | 248 | 39 |
| | 6 | Mo | 208 | 800 × 2 | 68 | 41 | 40 | 270 | Mo | 145 | 31 |
| | 7 | Mo | 220 | 850 × 2 | 74 | 53 | 49 | 253 | Mo | 165 | 38 |
| | 8 | Ni | 278 | 650 × 2 | 84 | 47 | 49 | 105 | Ni | 175 | 22 |
| | 9 | Ni | 255 | 700 × 2 | 90 | 58 | 57 | 97 | Ni | 188 | 33 |
| | 10 | Ta | 254 | 700 × 3 | 92 | 57 | 53 | 190 | Ta | 195 | 28 |

TABLE 7-continued

| No. | Spray Deposit M | T (μm) | Annealing Conditions (° C. × hr) | Surface Roughness (μm) S | Rv | Rp | Hardness (Hv) | Result of Evaluation TF | PL | NP |
|---|---|---|---|---|---|---|---|---|---|---|
| 11 | SUS 304 | 265 | 750 × 3 | 97 | 61 | 57 | 232 | Ti/ TiN | 110 | 34 |

M: Material,
T: Thickness,
CE: Comparative Example,
LL: Lower Layer,
UL: Upper Layer,
TF: Thin Film,
PL: Peeling (lot),
NP: Number of Particle (pieces)

Embodiment 8

To the components each of the earth shield 13, the upper deposition preventive plate 14, the lower deposition preventive plate 15 and the platen ring 17 of the sputtering apparatus shown in FIG. 7, two-layered spray deposits each shown in Table 8 are coated, respectively. Then, the surface of the spray deposits each, after cleansing, is heat treated under the conditions shown in Table 8. The surface roughness and hardness of each spray deposit are shown in Table 8.

As the substrate, Al alloy is used for sample No. 5 in Table 8, other than this SUS 304 being used. The conditions for coating of the spray deposits each are fundamentally the same with Embodiment 7. The Al spray deposit of sample No. 3 in Table 8 is arc sprayed with an Al wire of a diameter of 1.6 mm as raw material for spraying and under the conditions of a current of 200 A and a voltage of 30 V.

Next, the components each are assembled in the magnetron sputtering apparatus, on 8-inch wafers, thin films shown in Table 8 are deposited. The number of particles of which particle diameter is 0.2 μm or more is measured on each thin film. The thin film deposition process is continued. In terms of the number of lots where the number of the particles starts increasing, the life until the peeling occurs is checked. Furthermore, an average value of the numbers of the particles based on 150 lots is checked.

The results are shown in Table 8.

TABLE 8

| | No. | Spray Deposit (Material/Thickness μm) LL | UL | Annealing Conditions (° C. × hr) | Surface Roughness (μm) S | Rv | Rp | Hardness (Hv) LL | UL | Result of Evaluation TF | PL | NP |
|---|---|---|---|---|---|---|---|---|---|---|---|---|
| EMBODIMENT 8 | 1 | Al/ 207 | W/ 95 | 400 × 3 | 82 | 47 | 41 | 25 (Al) | 430 (W) | WSix | 285 | 12 |
| | 2 | Al/ 195 | W/ 103 | 400 × 3 | 84 | 49 | 50 | 24 (Al) | 422 (W) | WSix | 293 | 15 |
| | 3 | Al/ 158 | W/ 63 | 400 × 3 | 63 | 32 | 30 | 27 (Al) | 470 (W) | WSix | 345 | 17 |
| | 4 | Al/ 163 | W/ 51 | 400 × 5 | 69 | 37 | 34 | 23 (Al) | 454 (W) | WSix | 361 | 25 |
| | 5 | Al/ 155 | Cu/ 55 | 350 × 3 | 69 | 42 | 37 | 22 (Al) | 74 (Cu) | Ti/ TiN | 220 | 9 |
| | 6 | Al/ 146 | Cu/ 48 | 400 × 3 | 73 | 47 | 44 | 18 (Al) | 59 (Cu) | Ti/ TiN | 255 | 17 |
| | 7 | Al/ 184 | Mo/ 43 | 400 × 3 | 74 | 55 | 57 | 22 (Al) | 288 (Mo) | Mo | 240 | 15 |
| | 8 | Al/ 172 | Mo/ 58 | 400 × 5 | 91 | 72 | 68 | 20 (Al) | 277 (Mo) | Mo | 253 | 22 |
| | 9 | Al/ 133 | Ni/ 76 | 400 × 3 | 77 | 50 | 47 | 21 (Al) | 190 (Ni) | Ni | 266 | 10 |
| | 10 | Al/ 151 | Ni/ 47 | 400 × 5 | 83 | 56 | 54 | 18 (Al) | 179 (Ni) | Ni | 285 | 18 |
| | 11 | Al/ 145 | Ta/ 58 | 400 × 3 | 87 | 62 | 57 | 23 (Al) | 247 (Ta) | Ta | 275 | 12 |

CE: Comparative Example,
LL: Lower Layer,
UL: Upper Layer,
TF: Thin Film,
PL: Peeling (lot),
NP: Number of Particle (pieces)

Embodiment 9

To the components each of the earth shield 13, the upper deposition preventive plate 14, the lower deposition preventive plate 15 and the platen ring 17 of the sputtering apparatus shown in FIG. 7, two-layered spray deposits each shown in Table 9 are coated (underlayer; Cu spray deposit), respectively. Then, the surface of the spray deposits each, after cleansing, is heat treated under the conditions shown in Table 9. The surface roughness and hardness of each spray deposit are shown in Table 9.

As the substrates of the respective components, Ti alloy is used for sample Nos. 3 and 4 in Table 9, other than these SUS 304 being used. The conditions for coating of the spray deposits each are fundamentally the same with Embodiment 7. However, the Cu spray deposits each of sample Nos. 1, 2, 3, 4, 5 and 6 in Table 9 are arc sprayed with a Cu wire of a diameter of 1.6 mm as raw material for spraying and under the conditions of a current of 200 A and a voltage of 30 V.

Next, the components each are assembled in the magnetron sputtering apparatus, on 8-inch wafers, thin films shown in Table 9 are deposited. The number of particles of which particle diameter is 0.2 $\mu$m or more is measured on each thin film. The thin film deposition process is continued. In terms of the number of lots where the number of the particles starts increasing, the life until the peeling occurs is checked. Furthermore, an average value of the numbers of the particles based on 150 lots is checked.
The results are shown in Table 9.

Embodiment 10

To the components each (SUS 304 substrate) of the earth shield 13, the upper deposition preventive plate 14, the lower deposition preventive plate 15 and the platen ring 17 of the sputtering apparatus shown in FIG. 7, two-layered spray deposits (underlayer; Ni spray deposit) each shown in Table 10 are coated respectively by means of the plasma spraying. Then, the surface of the spray deposits each, after cleansing, is annealed under the conditions shown in Table 10. The surface roughness and hardness of each spray deposit are as shown in Table 10. The conditions for coating the respective spray deposits are identical as Embodiment 7.

Next, the components each are assembled in the magnetron sputtering apparatus, on 8-inch wafers, thin films shown in Table 10 are deposited. The number of particles of which particle diameter is 0.2 $\mu$m or more is measured on each thin film. The thin film deposition process is continued. In terms of the number of lots where the number of the particles starts increasing, the life until the peeling occurs is checked. Furthermore, the numbers of the particles are averaged on the basis of 150 lots to obtain an average value. The results are shown in Table 10.

TABLE 9

| | | Spray Deposit (Material/Thickness $\mu$m) | | Annealing Conditions (° C. × hr) | Surface Roughness ($\mu$m) | | | Hardness (Hv) | | Result of Evaluation | | |
|---|---|---|---|---|---|---|---|---|---|---|---|---|
| | No. | LL | UL | | S | Rv | Rp | LL | UL | TF | PL | NP |
| EMBODIMENT 9 | 1 | Cu/ 187 | Al/ 46 | 350 × 3 | 84 | 59 | 63 | 95 (Cu) | 25 (Al) | Al | 478 | 24 |
| | 2 | Cu/ 166 | Al/ 75 | 400 × 3 | 88 | 64 | 68 | 84 (Cu) | 22 (Al) | Al | 497 | 30 |
| | 3 | Cu/ 165 | Ti/ 47 | 500 × 3 | 61 | 37 | 33 | 62 (Cu) | 184 (W) | Ti/ TiN | 279 | 7 |
| | 4 | Cu/ 148 | Ti/ 67 | 600 × 3 | 64 | 41 | 37 | 51 (Cu) | 164 (Ti) | Ti/ TiN | 305 | 16 |
| | 5 | Cu/ 217 | W/ 38 | 800 × 3 | 58 | 30 | 34 | 43 (Cu) | 398 (W) | W | 85 | 25 |
| | 6 | Cu/ 197 | W/ 56 | 800 × 5 | 64 | 36 | 37 | 39 (Cu) | 377 (W) | W | 113 | 29 |
| | 7 | Cu/ 185 | Mo/ 55 | 800 × 3 | 70 | 46 | 45 | 45 (Cu) | 260 (Mo) | Mo | 273 | 11 |
| | 8 | Cu/ 168 | Mo/ 67 | 800 × 5 | 74 | 52 | 53 | 40 (Cu) | 252 (Mo) | Mo | 295 | 23 |
| | 9 | Cu/ 162 | Ni/ 58 | 750 × 3 | 68 | 47 | 43 | 49 (Cu) | 87 (Ni) | Ni | 297 | 7 |
| | 10 | Cu/ 155 | Ni/ 70 | 800 × 3 | 71 | 52 | 50 | 42 (Cu) | 79 (Ni) | Ni | 311 | 17 |
| | 11 | Cu/ 172 | Ta/ 83 | 750 × 3 | 74 | 52 | 49 | 56 (Cu) | 178 (Ta) | Ta | 304 | 8 |

CE: Comparative Example,
LL: Lower Layer,
UL; Upper Layer,
TF: Thin Film,
PL: Peeling (lot),
NP: Number of Particle (pieces)

TABLE 10

| | No. | Spray Deposit (Material/Thickness μm) LL | UL | Annealing Conditions (° C. × hr) | Surface Roughness (μm) S | Rv | Rp | Hardness (Hv) LL | UL | Result of Evaluation TF | PL | NP |
|---|---|---|---|---|---|---|---|---|---|---|---|---|
| EMBODIMENT 10 | 1 | Ni/ 157 | Al/ 64 | 350 × 3 | 87 | 64 | 59 | 207 (Ni) | 24 (Al) | Al | 423 | 29 |
| | 2 | Ni/ 146 | Al/ 55 | 400 × 3 | 93 | 75 | 69 | 187 (Ni) | 20 (Al) | Al | 463 | 38 |
| | 3 | Ni/ 127 | Cu/ 84 | 750 × 3 | 78 | 57 | 48 | 88 (Ni) | 55 (Cu) | Cu | 157 | 24 |
| | 4 | Ni/ 154 | Cu/ 53 | 800 × 3 | 82 | 61 | 54 | 74 (Ni) | 48 (Cu) | Cu | 174 | 32 |
| | 5 | Ni/ 203 | Ti/ 41 | 650 × 3 | 84 | 64 | 58 | 98 (Ni) | 153 (Ti) | Ti/ TiN | 164 | 13 |
| | 6 | Ni/ 216 | Ti/ 38 | 700 × 3 | 90 | 69 | 63 | 85 (Ni) | 140 (Ti) | Ti/ TiN | 183 | 19 |
| | 7 | Ni/ 172 | W/ 45 | 800 × 2 | 63 | 37 | 40 | 73 (Ni) | 410 (W) | WSix | 260 | 26 |
| | 8 | Ni/ 163 | W/ 56 | 800 × 5 | 68 | 42 | 43 | 69 (Ni) | 388 (W) | WSix | 277 | 31 |
| | 9 | Ni/ 152 | Mo/ 57 | 800 × 2 | 64 | 62 | 59 | 74 (Ni) | 279 (Mo) | Mo | 165 | 27 |
| | 10 | Ni/ 163 | Mo/ 42 | 800 × 5 | 88 | 69 | 58 | 68 (Ni) | 268 (Mo) | Mo | 184 | 31 |
| | 11 | Ni/ 149 | Ta/ 62 | 750 × 2 | 88 | 67 | 69 | 92 (Ni) | 185 (Ta) | Ta | 213 | 22 |

CE: Comparative Example,
LL: Lower Layer,
UL: Upper Layer,
TF: Thin Film,
PL: Peeling (lot),
NP: Number of Particle (pieces)

Embodiment 11

To the components each (SUS 304 substrate) of the earth shield 13, the upper deposition preventive plate 14, the lower deposition preventive plate 15 and the platen ring 17 of the sputtering apparatus shown in FIG. 7, Ti spray deposits each of an approximate thickness of 200 μm are coated respectively by means of the plasma spraying. Furthermore, for the target 11, high purity Ti is employed and for the backing plate 12, Al is used. Also on the non-erosion area of the periphery of the target 11 and on the surface of the backing plate 12, similarly Ti spray deposits each of an approximate thickness of 200 μm are deposited by means of the plasma spraying.

Then, the respective components thereon the Ti spray deopsit are coated and the surfaces of the Ti spray deposits of the target and the backing plate, after cleansing, are heat treated in a vacuum under the conditions of 350° C.×3 hr. The surface roughness of each Ti spray deposit is 72 μm of the mean spacing S of tops of local peak of profile, and 45 μm and 42 μm of the distances from the mean line to the bottom of profile valley line Rv and to the top of profile peak line Rp, respectively. Furthermore, the hardness of the Ti spray deposit is Hv 205.

The above components each, the target and the backing plate are assembled in the magnetron sputtering apparatus, similarly as Embodiment 1, on 8-inch wafers, Ti/TiN thin films are deposited. The number of particles of which particle diameter is 0.2 μm or more is measured on each Ti/TiN thin film. The thin film deposition process is continued. In terms of the number of lots where the number of the particles starts increasing, the peeling life is checked. Furthermore, the numbers of the particles are measured on the basis of 150 lots to obtain an average value. The peeling life is 144 lot and the average value of the number of the particles is 14 pieces.

In the present Embodiment 11, in comparison with the case where the target and the backing plate are not spray coated, the particles that are sporadically generated are not observed and the number of the particles is reduced by half. From these, it is confirmed that the particles may be effectively and stably suppressed from occurring.

INDUSTRIAL APPLICABILITY

As obvious from the above implementation modes, the present component for the vacuum deposit apparatus and the target apparatus may stably and effectively suppress the peeling of the deposition material that adheres during the deposition process. In addition to the above, the number of cleaning or exchange of the component also may be reduced. Accordingly, the vacuum deposit apparatus and the target apparatus of the present invention may be effectively used in various kinds of vacuum deposition apparatuses. Furthermore, the present vacuum deposition apparatus may suppress the particles from mingling in the deposit to cause failure of interconnection films or elements and may decrease the deposition cost due to the improvement of the working efficiency.

What is claimed is:

1. A component of a vacuum deposition apparatus, comprising:
   a component body; and
   a spray deposit coated on a surface of the component body and having surface roughness in which a mean spacing S of tops of local peak of profile is in a range from 50 to 150 μm, a distance from a mean line to a bottom of profile valley line Rv is in a range from 20 to 70 μm, and a distance from a mean line to a top of profile peak line Rp is in a range from 20 to 70 μm, wherein a difference in distance between the top of profile peak line Rp and the bottom of profile valley line Rv (Rp-Rv) is in a range from −11 to 6 μm so that a film adhered on the surface of the spray deposit grows with a stable columnar structure.

2. The component as set forth in claim 1:

wherein the spray deposit comprises a coat comprising metal of which thermal expansion coefficient is different by $15 \times 10^{-6}$/K or less from that of a material deposited by the vacuum deposition apparatus.

3. The component as set forth in claim 1:

wherein the spray deposit comprises a coat comprising metal of which thermal expansion coefficient is different by $20 \times 10^{-6}$/K or less from that of the component body.

4. The component as set forth in claim 1:

wherein the spray deposit comprises coats of two or more layers of different materials.

5. The component as set forth in claim 4:

wherein the spray deposit comprises a stress relief layer formed on the component body and comprising at least one of Al, Cu, or Ni or alloys of Al, Cu, or Ni, and a thermal expansion relief layer formed on the stress relief layer and comprising metal of which thermal expansion coefficient is different by $10 \times 10^{-6}$/K or less from that of a material deposited by the vacuum deposition apparatus.

6. The component as set forth in claim 1:

wherein the spray deposit comprises at least one coat selected from an Al base spray deposit of Vickers hardness of Hv 30 or less, a Cu base spray deposit of Vickers hardness of Hv 100 or less, a Ni base spray deposit of Vickers hardness of Hv 200 or less, a Ti base spray deposit of Vickers hardness of Hv 300 or less, a Mo base spray deposit of Vickers hardness of Hv 300 or less, and a W base spray deposit of Vickers hardness of Hv 500 or less.

7. The component as set forth in claim 1:

wherein the spray deposit has a thickness in the range from 50 to 500 μm.

8. The component as set forth in claim 1:

wherein the mean spacing S of tops of local peak of profile is more than 100 μm.

9. The component as set forth in claim 1:

wherein the mean spacing S of tops of local peak of profile is 107 μm or more.

10. A vacuum deposition apparatus, comprising:

a vacuum chamber;

a sample holder holding a sample to be deposited and disposed in the vacuum chamber;

a deposition material source disposed in the vacuum chamber facing to the sample holder;

a source holder holding the deposition material source; and a preventive component disposed in the surroundings of the sample holder or the source holder;

wherein at least one selected from the sample holder, the source holder and the preventive component comprises the component for a vacuum deposition apparatus set forth in claim 1.

11. The vacuum deposition apparatus as set forth in claim 10:

wherein the spray deposit formed on the surface of the component for a vacuum deposition apparatus comprises a coat containing at least one of metal forming the deposition material source.

12. The vacuum deposition apparatus as set forth in claim 10:

wherein the deposition apparatus is a sputtering apparatus.

13. A target apparatus, comprising:

a target body; and a spray deposit coated on a non-erosion area of the target body and having surface roughness in which a mean spacing S of tops of local peak of profile is in a range from 50 to 150 μm, a distance from a mean line to a bottom of profile valley line Rv is in a range from 20 to 70 μm, and a distance from a mean line to a top of profile peak line Rp is in a range from 20 to 70 μm, wherein a difference in distance between the top of profile peak line Rp and the bottom of profile valley line Rv (Rp-Rv) is in a range from −11 to 6 μm so that a film adhered on the surface of the spray deposit grows with a stable columnar structure.

14. The target apparatus as set forth in claim 13:

wherein the mean spacing S of tops of local peak of profile is more than 100 μm.

15. The target apparatus as set forth in claim 13:

wherein the mean spacing S of tops of local peak of profile is 107 μm or more.

16. A target apparatus, comprising:

a target; and a backing plate comprising a backing plate body holding the target, and a spray deposit coated on a surface of the backing plate body and having surface roughness in which a mean spacing S of tops of local peak of profile is in a range from 50 to 150 μm, a distance from a mean line to a bottom of profile valley line Rv is in a range from 20 to 70 μm, and a distance from a mean line to a top of profile peak line Rp is in a range from 20 to 70 μm, wherein a difference in distance between the top of profile peak line Rp and the bottom of profile valley line Rv (Rp-Rv) is in a range from −11 to 6 μm so that a film adhered on the surface of the spray deposit grows with a stable columnar structure.

17. The target apparatus as set forth in claim 16:

wherein the mean spacing S of tops of local peak of profile is more than 100 μm.

18. The target apparatus as set forth in claim 16:

wherein the mean spacing S of tops of local peak of profile is 107 μm or more.

* * * * *